(12) United States Patent
Suthar et al.

(10) Patent No.: US 8,448,122 B1
(45) Date of Patent: May 21, 2013

(54) IMPLEMENTING SUB-CIRCUITS WITH PREDICTABLE BEHAVIOR WITHIN A CIRCUIT DESIGN

(75) Inventors: Vishal Suthar, San Jose, CA (US); Hasan Arslan, Santa Clara, CA (US); Sridhar Krishnamurthy, San Jose, CA (US); Sanjeev Kwatra, Cupertino, CA (US); Srinivasan Dasasathyan, Sunnyvale, CA (US); Rajat Aggarwal, Los Altos, CA (US); Sudip K. Nag, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 514 days.

(21) Appl. No.: 12/416,326

(22) Filed: Apr. 1, 2009

(51) Int. Cl.
*G06F 17/50* (2006.01)
(52) U.S. Cl.
USPC ............ 716/128; 716/116; 716/117; 716/121
(58) Field of Classification Search .................. 716/119, 716/126, 133, 134, 116, 117, 121, 128
See application file for complete search history.

(56) References Cited

U.S. PATENT DOCUMENTS

| | | | |
|---|---|---|---|
| 6,519,756 B1 * | 2/2003 | Kao et al. ...................... | 716/103 |
| 6,857,110 B1 * | 2/2005 | Rupp et al. .................... | 716/136 |
| 8,181,148 B2 * | 5/2012 | Herzl et al. .................... | 716/139 |
| 2004/0243964 A1 * | 12/2004 | McElvain et al. ............... | 716/12 |
| 2005/0183055 A1 * | 8/2005 | Herrera .......................... | 716/17 |
| 2005/0268258 A1 * | 12/2005 | Decker ............................ | 716/4 |
| 2006/0053396 A1 * | 3/2006 | Eng ................................... | 716/7 |
| 2006/0129963 A1 * | 6/2006 | Martin et al. .................. | 716/11 |
| 2007/0044059 A1 * | 2/2007 | Martin et al. .................. | 716/11 |
| 2007/0150846 A1 * | 6/2007 | Furnish et al. .................. | 716/8 |
| 2007/0294658 A1 * | 12/2007 | Huang et al. .................... | 716/18 |
| 2009/0064071 A1 * | 3/2009 | Siarkowski et al. ............. | 716/6 |
| 2009/0235222 A1 * | 9/2009 | Raje et al. ...................... | 716/16 |
| 2009/0307639 A1 * | 12/2009 | Chapman et al. ................. | 716/4 |

\* cited by examiner

*Primary Examiner* — Nghia Doan
(74) *Attorney, Agent, or Firm* — Kevin T. Cuenot; LeRoy D. Maunu; Lois D. Cartier (57) ABSTRACT

A method of implementing a circuit design within a programmable integrated circuit (IC) can include identifying an implementation directive embedded within a register transfer level (RTL) description of the circuit design and determining components of a sub-circuit of the circuit design, wherein the sub-circuit is specified by a portion of the RTL description associated with the implementation directive. The sub-circuit can be placed for the programmable IC and routed for the programmable IC according to the implementation directive. A programmatic description of the sub-circuit specifying placement and routing information can be output.

18 Claims, 4 Drawing Sheets

IMPLEMENTING SUB-CIRCUITS WITH PREDICTABLE BEHAVIOR WITHIN A CIRCUIT DESIGN

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The embodiments disclosed herein relate to integrated circuit devices (ICs). More particularly, the embodiments relate to implementing a sub-circuit, such as intellectual property core, within a programmable IC in a manner that results in predictability with respect to selected operational characteristics of the sub-circuit.

BACKGROUND OF THE INVENTION

Programmable integrated circuit (IC) devices are a well-known type of integrated circuit that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines or wires of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

Programmable IC vendors typically provide computer-based design tools for use with their programmable ICs. These design tools receive a user-specified circuit design in the form of a hardware description language. One or more design constraints, e.g., timing requirements, for the circuit design also can be specified by the user within a separate user constraint file. The design tool can automatically map, place, and route the circuit design for implementation within a particular programmable IC in a manner that attempts to meet the specified design constraints.

Many programmable IC vendors also provide Intellectual Property (IP) cores for various applications to aid designers and simplify the circuit design process. Generally, an IP core refers to a pre-designed, programmatic description of hardware, e.g., a sub-circuit, that performs a particular function. The IP core can be specified in the form of a hardware description language file or files. An IP core, for example, can include source code or schematics that describe the logic and connectivity of a portion of a circuit design. Typical IP cores can provide digital signal processing (DSP) and/or mathematical functions or provide circuit elements such as memories, storage elements, etc.

Typically, programmable IC vendors provide information about the performance that can be expected from the IP cores when incorporated into a circuit design. The performance information usually sets forth stringent performance requirements for the various IP cores available from that programmable IC vendor. For example, a programmable IC vendor can provide a memory interface IP core and performance information stating that the memory interface IP core will have a maximum of 50 picoseconds (ps) of delay and a maximum of 50 ps of skew. Achieving the stated level of performance from an IP core when incorporated into one's circuit design, with any degree of predictability, can be challenging. Though users expect an IP core that is incorporated into a circuit design to perform in accordance with the programmable IC vendor's stated performance information, such is not always the case. Often, even minor changes to a circuit design will change the performance of any IP cores incorporated into that circuit design. The performance of an IP core also varies according to the type, e.g., architecture, of the programmable IC that is used.

Several factors undermine predictability of IP core performance. One factor that has been discussed relates to the stringent performance information provided with IP cores. Achieving the stated performance for delay and skew, for example, can significantly limit the solution space on the programmable IC. Another factor is the generic nature of conventional, automated place and route implementation tools. Conventional place and route tools optimize the entire circuit design. In performing this optimization, the tools treat each portion of the circuit design equally in terms of importance. This means that optimizing one portion of the circuit design can result in the IP core achieving something less than the stated performance metrics. Further, despite the potentially small solution space, the complexity of modern programmable ICs provides a large number of possible placements that still must be explored to achieve a solution. This large number of placements for the IP core makes achieving a solution that meets the stated, or expected, performance requirements difficult. Achieving a solution is particularly difficult given a limited amount of run-time, as is the case in real world circuit development.

As such, the conventional approach to achieving desired performance, e.g., timing closure, for an IP core is for a circuit designer to manually specify the circuit design. That is, the circuit designer must manually place one or more or even all of the components of the IP core on the programmable IC. The components of the IP core must then be routed. Like placement, routing the components is largely a manual process. The manually derived solution can be locked from further changes. This manual process is complex and time consuming. For example, manually specifying circuit elements of an IP core often takes days or weeks to complete. Moreover, the particular solution achieved will vary from one device architecture to another. This means that the process must be repeated for each different circuit design within which an IP core is incorporated and for each different programmable IC architecture that may be used.

SUMMARY OF THE INVENTION

The embodiments disclosed within this specification relate to implementing a sub-circuit, such as an intellectual property core, of a larger circuit design within a programmable integrated circuit (IC) in a manner that results in predictability with respect to selected operational characteristics of the sub-circuit. One embodiment of the present invention can include a computer-implemented method of implementing a circuit design within a programmable IC. The method can include identifying an implementation directive embedded within a register transfer level (RTL) description of the circuit design and determining components of a sub-circuit of the circuit design, wherein the sub-circuit is specified by a portion of the RTL description associated with the implementation directive. The sub-circuit for the programmable IC can be placed and routed according to the implementation directive. A programmatic description of the sub-circuit, including placement and routing information, can be output.

The method can include prioritizing the placing and the routing of the sub-circuit over implementing other portions of the circuit design that are not associated with an implementation directive embedded within the RTL description of the circuit design. The computer-implemented method further can include selecting the implementation directive to specify a power usage requirement for the sub-circuit, a delay requirement for signals of the sub-circuit, and/or a skew requirement for signals of the sub-circuit.

In one embodiment, the sub-circuit includes a plurality of signals and the implementation directive specifies a skew requirement for the plurality of signals. In that case, routing the sub-circuit includes determining a route having a minimum delay for each of the plurality of signals, selecting at least one of the routes of the plurality of signals having a smallest delay, and adjusting each selected route according to the skew requirement. Adjusting each selected route includes extending a length of each selected route.

Placing can include determining a relative placement for each component of the sub-circuit and determining an exact placement of the sub-circuit using the relative placement. In one aspect, the sub-circuit can include a plurality of instances of a module. In that case, placing can include determining a relative placement for the module according to the implementation directive, each component of the module, and available sites of the programmable IC. Placing also can include determining exact locations for each instance of the module using the relative placement for instance of the module within the sub-circuit.

Another embodiment of the present invention includes a computer-implemented method of implementing a circuit design within a programmable IC. The method includes determining components of a sub-circuit of the circuit design, wherein the sub-circuit is specified by at least one RTL instruction associated with an implementation directive embedded within an RTL description of the circuit design. The method includes placing the sub-circuit for the programmable IC according to the implementation directive prior to placing any other portion of the circuit design that is not associated with the implementation directive and routing the sub-circuit for the programmable IC according to the implementation directive prior to routing any other portion of the circuit design that is not associated with the implementation directive. A programmatic description of the sub-circuit, including placement and routing information, can be output.

In one aspect, the implementation directive can specify a power usage requirement for the sub-circuit. Accordingly, determining components of the sub-circuit includes selecting components for implementing the sub-circuit according to the implementation directive. In another aspect, the implementation directive can be selected to specify a delay requirement for signals of the sub-circuit and/or a skew requirement for signals of the sub-circuit.

Yet another embodiment of the present invention includes a computer program product including a computer-usable medium having computer-usable program code that, when executed by a computer, causes the computer to perform the various steps and/or functions disclosed herein.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed within this specification relate to implementing a sub-circuit of a circuit design in a manner that provides predictability of selected operational characteristics of that sub-circuit. In accordance with the embodiments disclosed herein, one or more implementation directives can be embedded or inserted directly into a register transfer level (RTL) description of a circuit design that is to be implemented within a programmable integrated circuit (IC). The implementation directives can be associated with one or more RTL instructions that specify a sub-circuit, such as an intellectual property (IP) core, within the larger circuit design.

Computer-based implementation tools can detect each implementation directive. Each implementation directive can be carried forward and associated with the components determined from the RTL instructions that are associated with the implementation directive. The implementation directive can be observed during the various stages of synthesis, e.g., mapping, placement, and/or routing, to ensure that the sub-circuit is implemented in accordance with the implementation directive. When the sub-circuit implementation conforms to the implementation directive, predictability of the sub-circuit in terms of those operational characteristics specified by the implementation directive is achieved.

RTL refers to a high-level representation of a digital, synchronous circuit. An RTL description specifies behavior of the circuit design and, as such, is hardware agnostic. The behavior of the circuit design is specified in terms of the flow of signals, or data. For example, within an RTL description, signals flow from register to register and may flow through combinatorial logic between registers. Combinatorial logic can be specified in terms of logical operations or functions applied to the signals.

Conventional techniques for specifying circuit design constraints typically result in a global application of the constraint to the entire circuit design and/or a global optimization of the entire circuit design. As such, a critical portion of the circuit design, such as an IP core, may not meet the stringent requirements necessary to ensure that the critical portion of the circuit design functions properly or as expected.

In accordance with the embodiments described herein, the implementation tools can determine a priority among different portions of the RTL description during the implementation process. The implementation tools can prioritize those portions of the RTL description that are controlled by, or associated with, an implementation directive over those portions of the RTL description of the circuit design that are not. When a solution is found that conforms to the implementation directive, that portion of the circuit design can be locked, or otherwise preserved, throughout the remainder of the implementation process.

Figure 1:
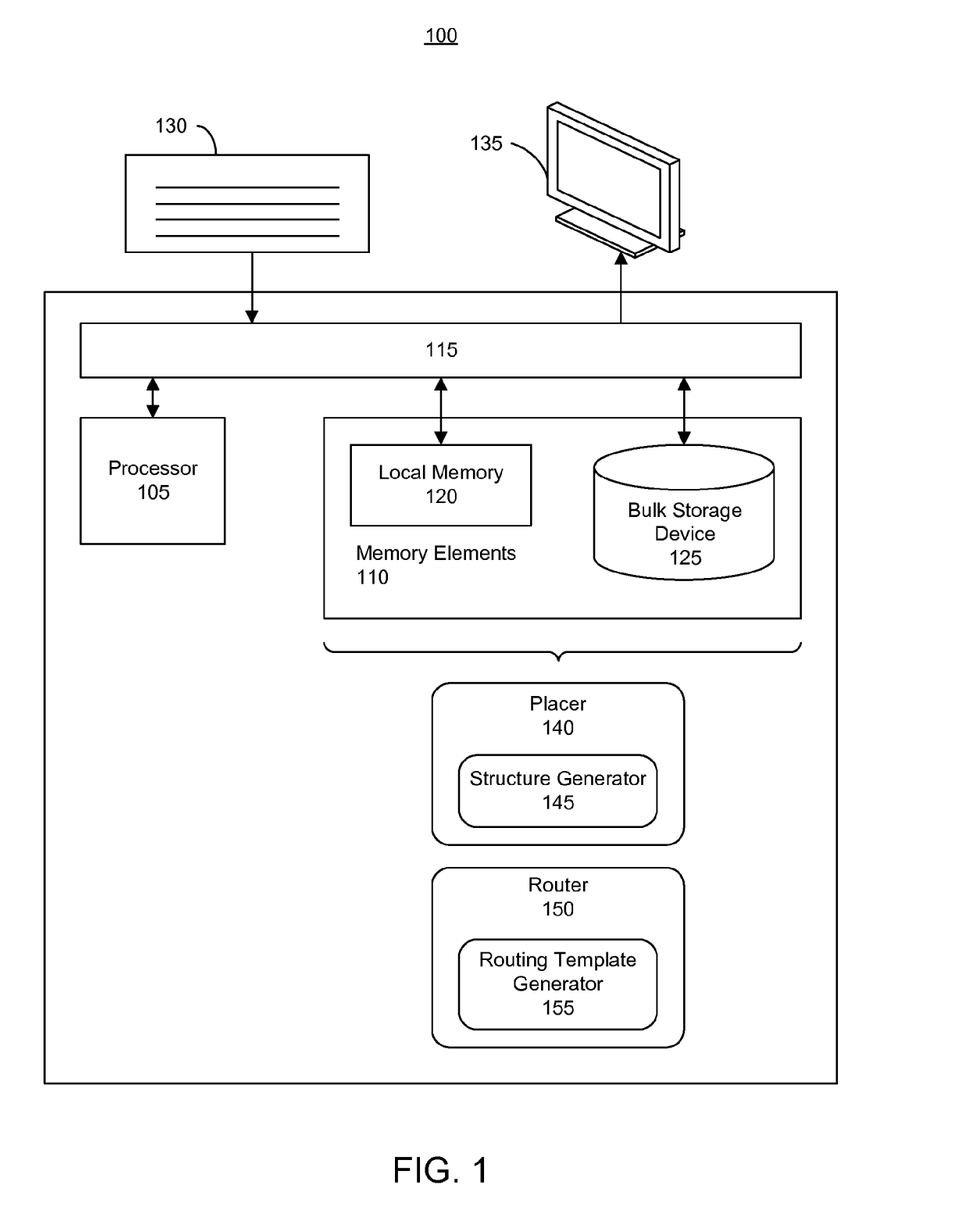
FIG. 1 is a first block diagram illustrating a system for implementing a sub-circuit of a circuit design in accordance with one embodiment of the present invention.

FIG. 1 is a first block diagram illustrating a system for implementing a sub-circuit of a circuit design in accordance with one embodiment of the present invention. System 100 can be implemented in the form of a computer system that is suitable for storing and/or executing program code. Accordingly, system 100 can include at least one processor 105 coupled directly or indirectly to memory elements 110 through a system bus 115. Memory elements 110 can include one or more physical memory devices such as, for example, local memory 120 and one or more bulk storage devices 125. Local memory 120, such as random access memory or other non-persistent memory device(s), is generally used during actual execution of the program code. Bulk storage device(s) 125 can be implemented as a hard drive or other persistent data storage device. System 100 also can include one or more cache memories (not shown) that provide temporary storage of at least some program code in order to reduce the number of times code must be retrieved from bulk storage device 125 during execution.

Input/output (I/O) devices such as a keyboard 130, a display 135, and a pointing device (not shown) optionally can be coupled to system 100. The I/O devices can be coupled to system 100 either directly or through intervening I/O controllers. Network adapters also can be coupled to system 100 to enable system 100 to become coupled to other computer systems, remote printers, and/or remote storage devices through intervening private or public networks. Modems, cable modems, and Ethernet cards are just a few of the currently available types of network adapters.

As shown, memory elements 110 of system 100 can store a placer 140 having a structure generator 145. Placer 140, when executed by system 100, "places" a circuit design. "Placing" a circuit design refers to the process of assigning circuit components of the circuit design, to which logic primitives of the synthesized circuit design have been mapped, to actual locations on the programmable IC within which the circuit design will be implemented (hereafter the "target programmable IC"). For example, once logic gates are assigned to LUTs for implementation, combinations of logic gates can be assigned to a particular LUT, having a physical location, on the target programmable IC.

Structure generator 145, which will be described in greater detail with reference to the remaining figures, can identify one or more implementation directives within an RTL description of a circuit design. Structure generator 145 can follow those implementation directives when placing the components of the circuit design controlled by, or associated with, the implementation directive(s). For example, one or more implementation directives can be included in the RTL description of the circuit design and associated with one or more RTL instructions specifying a sub-circuit of the circuit design, e.g., an IP core. In determining a placement solution that conforms to the implementation directive(s), structure generator 145 can explore a plurality of solutions in terms of locating different components of the sub-circuit to which the implementation directive(s) apply.

Memory elements 110 also can store a router 150 having a routing template generator 155. Router 150, when executed by system 100, can "route" a circuit design. "Routing" a circuit design generally refers to the process of determining the interconnect circuitry, e.g., particular wires and connections between wires, of the programmable IC that will be used to establish the necessary electrical paths allowing signals to pass among the various circuit components implemented on the target programmable IC. The set of wires and interconnects can be referred to as "routing resources" of the target programmable IC. The interconnect settings of the routing resources that specify which wires are used, which interconnects are used, which wires are connected via the interconnects, and the like, to convey a particular signal collectively specify a "route" for that signal.

Routing template generator 155, which also will be described in greater detail with reference to the remaining figures, can identify one or more implementation directives inserted into the RTL description of the circuit design. Routing template generator 155 adheres to those implementation directives when routing the particular signals controlled by, or associated with, the identified implementation directive. In determining a routing solution that conforms to the implementation directive, routing template generator 155 can explore one or more route solutions for each of the signals controlled by the implementation directive.

In illustration, a designer can insert an implementation directive into an RTL description of a circuit design. The implementation directive can apply to one or more statements within the RTL description that, for example, specify a sub-circuit of the circuit design that is of critical importance in terms of one or more operational parameters specified by the implementation directive(s). Structure generator 145 and routing template generator 155 each can identify the implementation directive(s) and determine placement and routing for the sub-circuit that conforms to the implementation directive(s).

Figure 2:
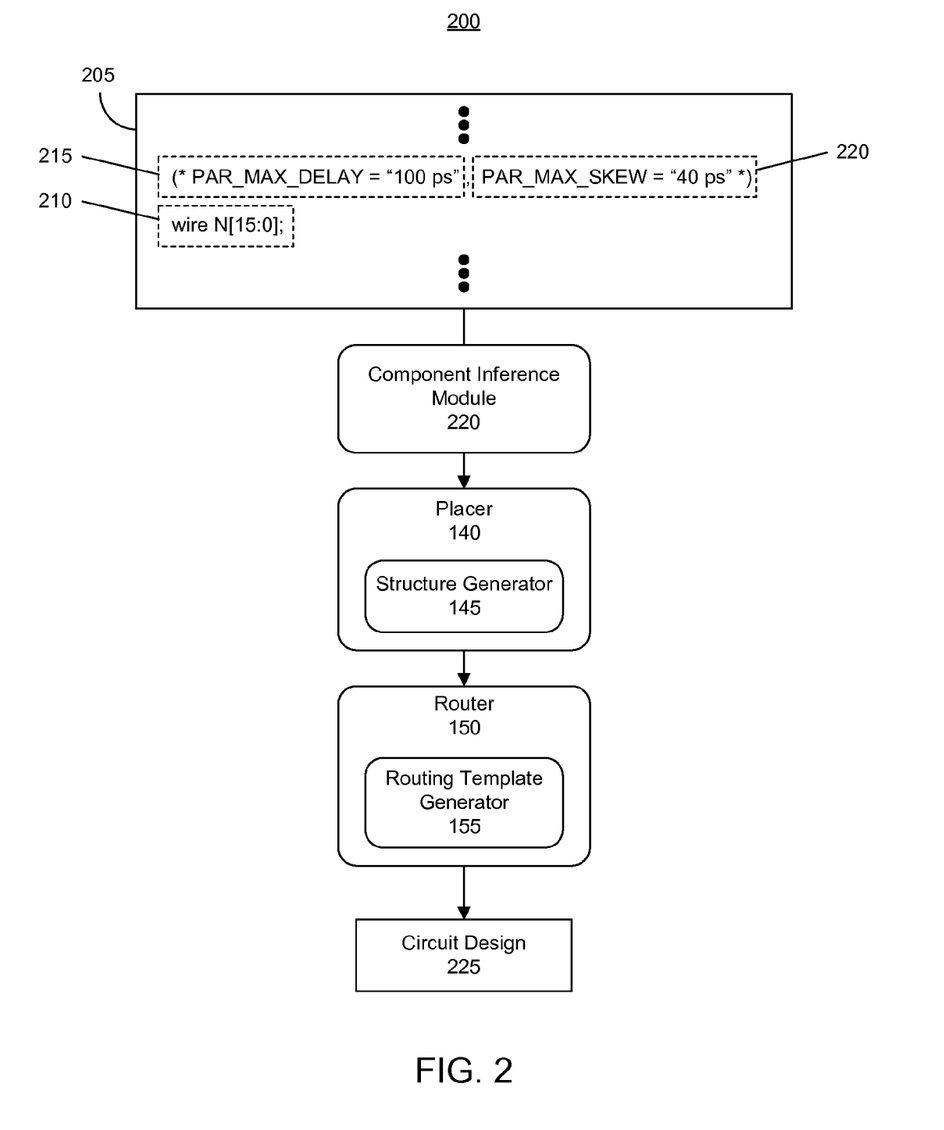
FIG. 2 is a flow diagram illustrating a method of implementing a sub-circuit of a circuit design in accordance with another embodiment of the present invention.

FIG. 2 is a flow diagram 200 illustrating a method for implementing a sub-circuit of a circuit design in accordance with another embodiment of the present invention. The flow diagram 200 includes an RTL description 205 of a circuit design that is to be implemented within a target programmable IC. For ease of illustration, only a limited number of RTL instructions are shown. Like numbers will be used to refer to the same items throughout this specification.

RTL description 205 includes an RTL instruction 210 and two implementation directives 215 and 220. RTL instruction 210 is "wire N[15:0]". RTL instruction 210 specifies 16 nets numbering 0 to 15 that collectively form a 16-bit bus. In this example, the implementation directives 215 and 220 are set off, or distinguished from, RTL instructions through the use of "(*" to indicate the start of one or more implementation directives and "*)" to indicate the end of one implementation directive or a plurality of implementation directives.

Implementation directive 215 is "PAR_MAX_DELAY='100 ps'". Implementation directive 215 specifies that the sub-circuit specified by, or derived from, RTL instruction 210 is to have a maximum delay of 100 picoseconds (ps). Therefore, the maximum delay of any route determined for each of the 16 nets of the 16-bit bus will be 100 ps. Implementation directive 220 is "PAR_MAX_SKEW='40 ps'". Implementation directive 220 specifies that the sub-circuit specified by, or derived from, RTL instruction 210 is to have a maximum skew of 40 ps with respect to the different routes that are to be generated to implement the 16-bit bus. Skew refers to the difference in arrival time of signals at selected loads of a circuit design. In this case, skew refers to the arrival time of signals at loads of each of the 16 nets. Ideally, a circuit designer would like to minimize skew in a circuit design. Minimizing skew, in general, improves performance and scalability across process corners.

For purposes of illustration, an implementation directive, or a plurality of implementation directives, will be interpreted by the implementation tools to apply to the RTL instruction immediately following the implementation directive(s). It should be appreciated, however, that other techniques can be used to associate particular RTL instructions, or a plurality of RTL instructions, with one or more implementation directives. As such, the embodiments described within this specification are not intended to be limited to the case where an implementation directive applies solely to the RTL instruction immediately following.

A component inference module 225 can process RTL description 205. Component inference module 225 correlates components that are available within the target programmable IC with RTL instructions of RTL description 205. For example, the various RTL instructions, such as RTL instruction 210, can be mapped to, or correlated with, components such as wires, registers, memories, logic blocks, etc., of the target programmable IC. In one embodiment, component interface module 225 can be implemented as a mapping module executing in a computer system with placer 140 and router 150. In general, RTL instruction 210 can be correlated with 16 nets inclusive of the sources and loads of such nets.

Once circuit components are ascribed to the RTL instructions of RTL description 205, placer 140, and in particular structure generator 145, can process RTL description 205 with reference to the correlated components and the sites of the target programmable IC that are capable of being programmed to implement the components. Structure generator 145 can identify those circuit components that are derived from any RTL instruction controlled by an implementation directive such as implementation directive 215 and/or implementation directive 220. Structure generator 145 can explore potential placements of the components to identify those that meet or exceed the implementation directives controlling, or which are applicable to, those components. With respect to implementation directives 215 and 220, structure generator 145 can explore different placements of the components coupled to the 16-bit bus that are more likely than other placements to provide a delay of less than 100 ps and a skew of less than 40 ps.

Similarly, router 150, and in particular routing template generator 155, can process RTL description 205 with reference to the correlated components, placement information, and routing resources of the target programmable IC. Routing template generator 155 can identify those signals of the RTL description 205, such as RTL instruction 210, that are controlled by one or more implementation directives such as implementation directive 210 and/or implementation directive 220. Routing template generator 155 can route the signals of the circuit design that are controlled by implementation directives. With regard to FIG. 2, routing template generator 155 can route the signals specified by RTL instruction 210, i.e., the signals of the 16-bit bus.

In the example pictured in FIG. 2, routing template generator 155 routes each of the signals corresponding to RTL instruction 210 to achieve a best possible delay. Once routed, routing template generator 155 can adjust one or more or all of the routes to achieve a skew that meets implementation directive 220.

Router 150, or routing template generator 155, can output circuit design 225. As used herein, "outputting" and/or "output" means, for example, writing to a file, writing to a user display or other output device, storing in memory, playing audible notifications, sending or transmitting to another system, exporting, or the like. In one embodiment, circuit design 225 can be implemented as a programmatic description of the circuit design including placement information and routing information for any sub-circuits that are associated with an implementation directive. In another embodiment, once structure generator 145 and routing template generator 155 complete operation, any other portions of the circuit design that are not associated with an implementation directive can be placed and/or routed. In that case, circuit design 225 includes placement and routing information for the entire circuit design or at least or one or more additional portions of the circuit design not associated with an implementation directive.

Figure 3:
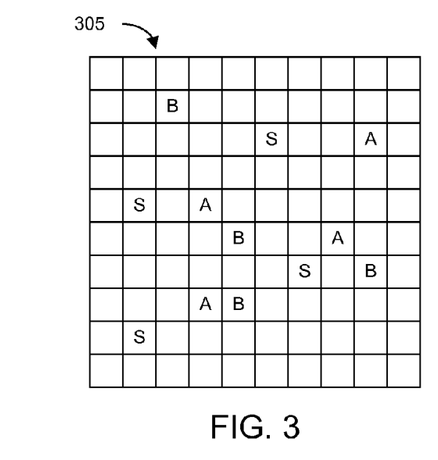
FIG. 3 is a second block diagram illustrating an aspect of a placement process in accordance with another embodiment of the present invention.
Figure 4:
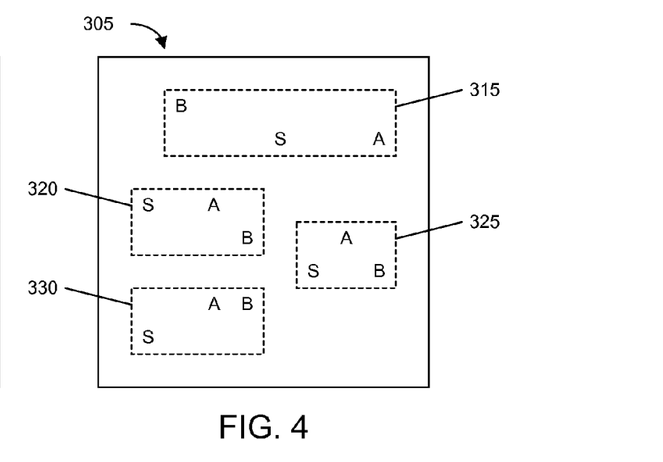
FIG. 4 is a third block diagram further illustrating the placement process illustrated in FIG. 3.

FIGS. 3 and 4, taken collectively, are second and third block diagrams illustrating one aspect of a placement process in accordance with another embodiment of the present invention. More particularly, FIGS. 3 and 4 illustrate a process in which relative placements are determined for a sub-circuit that is controlled by one or more implementation directives.

FIG. 3 illustrates an exemplary architecture of a target programmable IC where a sub-circuit of a larger circuit design is being placed. In general, FIG. 3 illustrates available sites on target programmable IC 305 as a grid. Each block of the grid represents a site that can be programmed to implement a selected component. In the example pictured in FIG. 3, the sub-circuit comprises multiple instances of components labeled S, A, and B. For purposes of illustration, components labeled S are sources. Components labeled A and B are loads of components S.

The sub-circuit represented by the multiple instances of components S, A, and B can be, for example, a 4-bit bus. For purposes of discussion, each set formed of a single instance of each of components S, A, and B can be said to be a module. As such, the sub-circuit is formed of four instances of the module. For ease of illustration, a 4-bit bus is illustrated as opposed to the 16-bit bus described with reference to FIG. 2. The implementation directives described with reference to FIG. 2, however, can be applied in the same manner regardless of the type or the size of the sub-circuit specified.

The structure generator of the placer, having identified an implementation directive and a sub-circuit controlled by that implementation directive, can begin to explore relative placements for the module having components S, A, and B. FIG. 3 illustrates four potential relative placement solutions for the module on programmable IC 305. Presuming that the delay implementation directive described with reference to FIG. 2 applies in the example of FIG. 3, the structure generator will evaluate each of the potential, relative placements for the module in terms of the likelihood of each instance of the module achieving the desired delay and/or skew.

FIG. 4 represents the same target programmable IC 305 as illustrated in FIG. 3. The gridlines in FIG. 4, however, have been removed to more clearly reflect the potential relative placement solutions for the module formed of components S, A, and B. FIG. 4 shows four relative placements 315, 320, 325, and 330 that have been determined by the structure generator for the module. A "relative placement" refers to determined locations for each of the components of the sub-circuit, or module within the sub-circuit, in relation to one another, but not in absolute terms with regard to the programmable IC. For example, a relative placement can be moved about the programmable IC 305 to particular sites while maintaining the relative spacing or distances among the various components S, A, and B, for example.

Each of relative placements 315-330 can be evaluated by the placer and/or structure generator, as the case may be, to determine whether that relative placement meets the implementation directive(s), e.g., maximum delay. For example, the structure generator can select the relative placement that, once routed, is estimated to meet the delay requirements. In the example of FIG. 4, the structure generator can select relative placement 325 as being the relative placement having the best characteristics in terms of timing.

Figure 5:
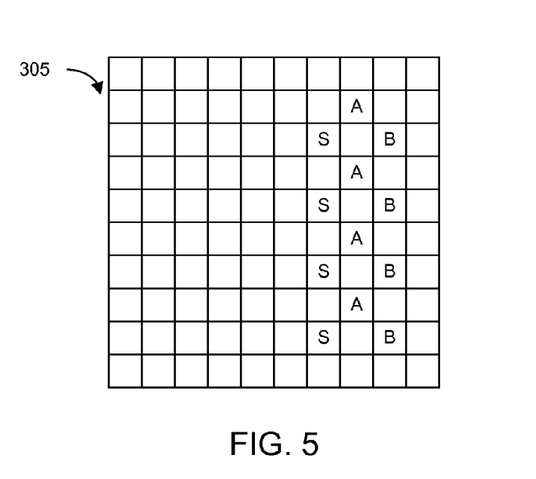
FIG. 5 is a fourth block diagram illustrating another aspect of the placement process in accordance with another embodiment of the present invention.

FIG. 5 is a fourth block diagram illustrating another aspect of the placement process in accordance with another embodiment of the present invention. FIG. 5 illustrates the same target programmable IC 305 as illustrated in FIGS. 3 and 4. Within FIG. 5, however, each instance of the module has been placed using the relative placement selected in FIG. 4. Thus, an exact placement of the sub-circuit is performed. In determining the exact placement of each instance of the module, the skew implementation directive can be observed. The placer and/or the structure generator can align each instance of the module in a manner that yields a best possible skew result. Though not shown, it should be appreciated that the structure generator and/or the placer can implement an exploration process in which different exact placement solutions, using the selected relative placement solution for each module instance, are explored.

Figure 6:
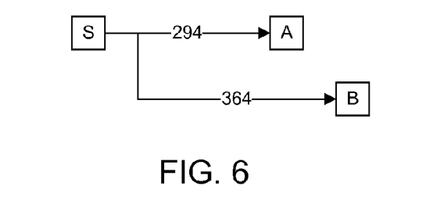
FIG. 6 is a first schematic diagram illustrating a routing technique in accordance with another embodiment of the present invention.
Figure 7:
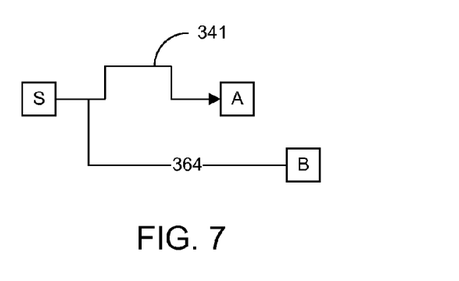
FIG. 7 is a second schematic diagram illustrating another aspect of the routing technique described with reference to FIG. 6.

FIGS. 6 and 7, taken collectively, are first and second schematic diagrams illustrating a routing technique in accordance with another embodiment of the present invention. More particularly, FIGS. 6 and 7 illustrate a routing process that can be performed to ensure that the sub-circuit conforms to an implementation directive specifying a skew requirement.

In one embodiment, routes having the smallest amount of delay can be determined. Routes for the module formed of components S, A, and B can be determined. In the example of FIG. 6, the route having the smallest amount of delay from component S to component A has a delay of 294 ps. The route having the smallest amount of delay from component S to component B has a delay of 364 ps. The difference in the delay of the route from component S to component A and the route from component S to component B is 70 ps. This means that the skew of the module is 70 ps.

Whereas FIG. 6 illustrated that each signal is routed to achieve a lowest delay possible, FIG. 7 illustrates that once such minimum delay routes are determined, one or more or all of the routes can be altered to decrease skew. Presuming that the skew implementation directive setting a maximum skew of 40 ps is still applicable, the router, and in particular the routing template generator, can begin adding wire length to one or more or all routes of the sub-circuit, in this case the module, in an effort to decrease the skew. In the example shown in FIG. 7, the route from component S to component A has been modified, e.g., made longer, resulting in a delay of 341 ps. The route, or routes, of the sub-circuit or module with the smallest delay can be made longer. Having modified the route from component S to component A, the new skew of the module is 23, which meets the established skew implementation directive.

Implementation directives relating to delay and skew requirements for a sub-circuit have been used as examples within this specification. It should be appreciated that implementation directives within an RTL description of a circuit design are not limited solely to these cases. Another example of an implementation directive can be a power related implementation directive. In that case, any sub-circuit that is associated with a power related implementation directive, e.g., one specifying a maximum amount of power that should be dissipated over time by the sub-circuit, can be implemented to conform to such a directive. In the case of a power directive, for example, component selection, placement, and routing can be performed to reduce power dissipation to a level that conforms to the power dissipation requirement enumerated within the power related implementation directive.

In further illustration, an exemplary implementation directive such as "MAP_POWER_OPTIMIZED," when inserted into an RTL description of a circuit design can cause the implementation tools to optimize the sub-circuit associated with the implementation directive with respect to minimizing power consumption. As an example, the map phase of implementation can map or correlate software constructs of the circuit design, e.g., those specified in the RTL description, with the actual physical resources available on the target programmable IC. For example, portions of the RTL description can be mapped to look-up tables (LUTs), latches, flip-flops, block random access memories (BRAMs), or the like. When a given portion of the sub-circuit can be mapped to more than one type of component, the component that results in lower power consumption can be selected in lieu of another component that would result in the sub-circuit consuming more power. Component selection further can be balanced with regard to increases in route length that occur due to the location of each potential component on the target programmable IC.

Figure 8:
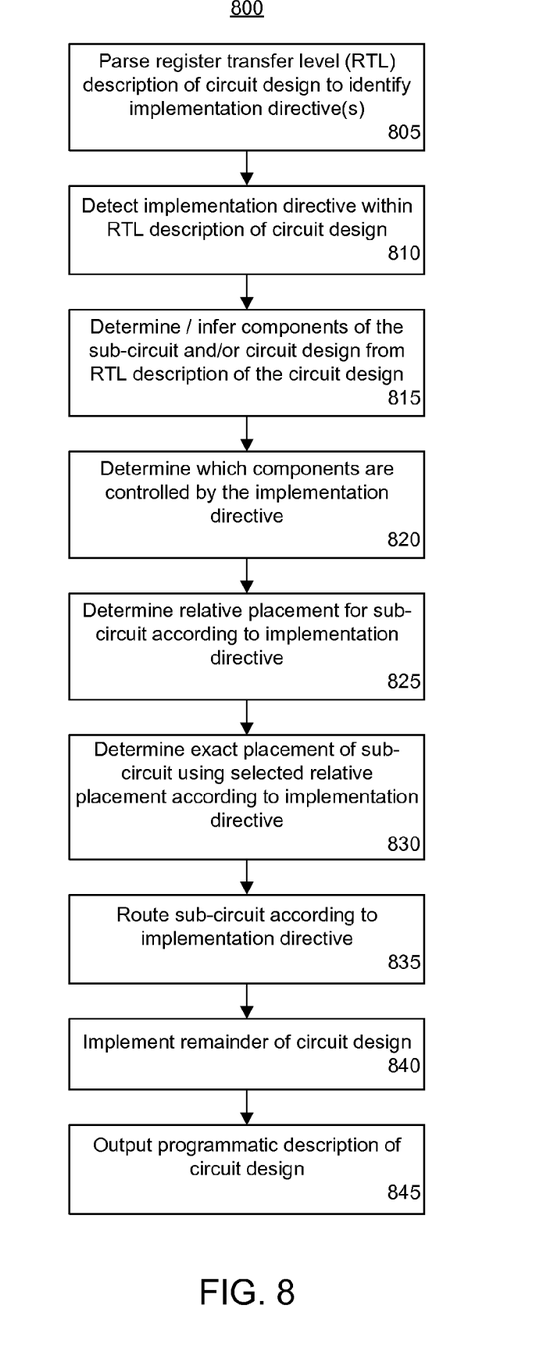
FIG. 8 is a flow chart illustrating a method of implementing a circuit design using implementation directives in accordance with another embodiment of the present invention.

FIG. 8 is a flow chart illustrating a method 800 of implementing a circuit design using implementation directives in accordance with another embodiment of the present invention. In one aspect, the embodiments disclosed herein can be applied to sub-circuits with repeated circuitry or circuit structures as illustrated herein. Method 800 can be performed using a system as described with reference to FIGS. 1 and 2, for example. Method 800 can begin in a state where one or more implementation directives have been embedded, or inserted, into an RTL description of a circuit design. As such, the implementation directives apply to selected RTL instructions specifying a sub-circuit of the larger circuit design. The RTL description of the circuit design can be loaded into, or otherwise identified to, implementation tools of the variety described within this specification.

In step 805, the system can parse the RTL description of the circuit design to identify implementation directives embedded within the RTL description. In step 810, the system can detect an implementation directive within the RTL description of the circuit design. In step 815, the system can infer, or derive, components for the circuit design from the RTL description of the circuit design. In one embodiment, the system can determine components for the sub-circuit that is specified by the RTL instructions associated with the implementation directive. In that case, the system can determine such components prior to determining components for other portions of the circuit design that are not associated with any implementation directive. The sub-circuit can be processed, e.g., placed and routed as described prior to deriving any other components of the circuit design. In another embodiment, the system can determine components for the entire circuit design, inclusive of any components for the sub-circuit specified by the RTL instructions associated with the implementation directive. In step 820, any components that are determined, inferred, or otherwise derived from RTL instructions to which the implementation directive is associated can be tagged or otherwise marked as being controlled by the implementation directive(s). In this manner, components that are controlled by the implementation directive can be determined.

In another embodiment, components of the sub-circuit can be derived in accordance with any applicable implementation directive(s), e.g., as in the case of power related implementation directives. In such an embodiment, components derived from RTL instructions associated with an implementation directive can be determined, e.g., during mapping, prior to determining components for other RTL instructions not associated with an implementation directive.

In step 825, the system can determine a relative placement for the sub-circuit according to the implementation directive that applies to the sub-circuit. In the event that the sub-circuit includes a plurality of instances of a module, a relative placement for that module can be determined. In step 830, the system can determine an exact placement of the sub-circuit according to the implementation directive that applies to the sub-circuit. The exact placement can be determined using the relative placement determined in step 825. That is, the sub-circuit, while using the relative placement, can be assigned a location on the target programmable IC.

In step 835, the system can route the sub-circuit. In one embodiment, a route having a lowest or best delay for each signal of the sub-circuit can be determined. In the event that the implementation directive that controls the sub-circuit also specifies a skew requirement, the routes can be altered as described to reduce skew to a level that conforms to the applicable implementation directive. As noted, the system can prioritize the placement process and routing process of the sub-circuit by placing and routing the sub-circuit prior to placing and/or routing any other portion of the circuit design that is not associated with an implementation directive.

In step 840, the system can implement the remainder of the circuit design. In doing so, the system can lock the sub-circuit in terms of placement and routing so that the process of implementing, e.g., placing and routing, the remainder of the circuit design will not disturb the sub-circuit. The sub-circuit is left intact and unchanged. In step 845, a programmatic description of the circuit design, inclusive of the sub-circuit can be output. In another embodiment, a programmatic description of the sub-circuit specifying placement and routing information can be output independently of the programmatic description of the larger circuit design.

The embodiments disclosed within this specification have been described using explicit implementation directives that specify particular numerical requirements.

In another embodiment, the implementation directives can specify requirements more broadly using terms that are not fixed or otherwise specified numerically. For example, a delay related implementation directive can be specified as "PAR_MAX_DELAY='CRITICAL'". An implementation directed that is not fixed and specifies a property such as "critical" can cause the system to achieve a best possible operational characteristic, e.g., best delay, lowest power consumption, or smallest skew, for the sub-circuit as opposed to achieving a particular numerical result for a given operational characteristic. Further, different properties can be applied that allow one to prioritize one sub-circuit over another, e.g., where one sub-circuit has an implementation directive with a "normal" property while another sub-circuit has a similar implementation directive with a "critical" property.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

Embodiments of the present invention can be realized in hardware and/or a combination of hardware and software.

The embodiments can be realized in a centralized fashion in one data processing system or in a distributed fashion where different elements are spread across several interconnected data processing systems. Any kind of data processing system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, magneto-optical media, computer memory such as random access memory or hard disk(s), or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A method of implementing a circuit design within a programmable integrated circuit (IC), the method comprising:
    identifying each of a plurality of implementation directives embedded within a register transfer level description of the circuit design;
    mapping, using a processor, each sub-circuit of a plurality of sub-circuits of the circuit design specified by a portion of the register transfer level description and associated with one of the plurality of implementation directives, to at least one component of the programmable IC in which the circuit design is to be implemented;
    wherein at least one of the plurality of implementation directives specifies, at least in part, a power usage requirement for the associated sub-circuit;
    responsive to determining that a portion of a sub-circuit of the circuit design is associated with an implementation directive that specifies a power usage requirement and is mappable to more than one type of component, selecting one component of the more than one type of component that results in lower power consumption for mapping of the sub-circuit to the one component;
    wherein at least one implementation directive of the plurality of implementation directives includes a property indicating priority of the implementation directive with respect to others of the implementation directives;
    prioritizing the plurality of sub-circuits for placing and routing according to the property indicating priority of the at least one implementation directive;
    placing the plurality of sub-circuits for the programmable IC according to the plurality of implementation directives;
    routing the plurality of sub-circuit for the programmable IC according to the plurality of implementation directives; and
    outputting a programmatic description, comprising placement and routing information, for the plurality of sub-circuits.

2. The method of claim 1, further comprising prioritizing the placing and the routing of the sub-circuit over implementing other portions of the circuit design that are not associated with an implementation directive embedded within the register transfer level description of the circuit design.

3. The method of claim 1, wherein the implementation directive comprises an instruction having a non-numerical parameter causing an implementation tool to explore a plurality of sub-circuit implementations and select a sub-circuit implementation in which a measured quantity indicated by the instruction is optimized in lieu of specifying a numerical value for the parameter of the instruction that is to be achieved for the measured quantity by the implementation tool.

4. The method of claim 1, further comprising selecting the implementation directive to specify a skew requirement for signals of the sub-circuit.

5. The method of claim 1, wherein the sub-circuit comprises a source and a plurality of loads and the implementation directive specifies a skew requirement for a signal from the source to each of the plurality of loads, wherein routing the sub-circuit comprises:
    determining a route, having minimum delay, from the source to each of the plurality of loads;
    selecting, from among the routes to each of the plurality of loads, at least one of the routes having a smallest amount of delay; and
    adjusting each selected route according to the skew requirement.

6. The method of claim 5, wherein adjusting each selected route further comprises extending a length of each selected route.

7. The method of claim 1, wherein the sub-circuit comprises a plurality of instances of a module, wherein placing comprises determining a relative placement for the module according to the implementation directive, each component of the module, and available sites of the programmable IC.

8. The method of claim 7, wherein placing further comprises determining exact locations for each instance of the module using the relative placement for each instance of the module within the sub-circuit.

9. The method of claim 1, further comprising:
locking a placement or a routing of the sub-circuit specified by the portion of the register transfer level description associated with the implementation directive when placing or routing any other portion of the circuit design that does not include a register transfer level description associated with an implementation directive.

10. A method of implementing a circuit design within a programmable integrated circuit (IC), the method comprising:
determining at least one component for each of a plurality of sub-circuits of the circuit design, wherein each sub-circuit is specified by at least one register transfer level instruction associated with an implementation directive embedded within a register transfer level description of the circuit design;
wherein at least one of the implementation directives specifies, at least in part, a power usage requirement for the associated sub-circuit;
wherein the determining of the at least one component comprises selecting one component that results in lower power consumption based on the power usage requirement for the associated sub-circuit, the one component being selected from a plurality of components to which the sub-circuit can be mapped;
wherein each implementation directive includes a property indicating priority with respect to at least one other implementation directive;
prioritizing the plurality of sub-circuits according to the property indicating priority within each associated implementation directive;
placing, using a processor, each sub-circuit associated with an implementation directive for the programmable IC according to the prioritization of the sub-circuit and prior to placing any other portion of the circuit design that is not associated with the implementation directive;
routing each sub-circuit associated with an implementation directive for the programmable IC according to the prioritization of the sub-circuit and prior to routing any other portion of the circuit design that is not associated with the implementation directive; and
outputting a programmatic description, comprising placement and routing information, for the sub-circuit.

11. The method of claim 10, wherein the implementation directive specifies a power usage requirement for the sub-circuit, wherein determining components of the sub-circuit comprises selecting components for implementing the sub-circuit according to the implementation directive.

12. The method of claim 10, further comprising, for each sub-circuit, tagging each component of the sub-circuit as being controlled by the implementation directive associated with the register transfer level instructions from which the component is determined, wherein each component is a component of the programmable IC in which the circuit design is to be implemented.

13. The method of claim 12, further comprising selecting the implementation directive to specify a skew requirement for signals of the sub-circuit.

14. The method of claim 10, further comprising:
locking a placement or a routing of the sub-circuit including the at least one register transfer level instruction associated with the implementation directive when placing or routing any other portion of the circuit design that does not include a register transfer level instruction associated with an implementation directive.

15. A computer program product comprising:
a non-transitory computer-usable medium comprising computer-usable program code that, when executed by a computer system, implements a circuit design for a programmable integrated circuit (IC), the computer-usable medium comprising:
computer-usable program code that identifies each of a plurality of implementation directives embedded within a register transfer level description of the circuit design;
computer-usable program code that maps each sub-circuit of a plurality of subcircuits of the circuit design specified by a portion of the register transfer level description and associated with the implementation directive, to at least one component of the programmable IC in which the circuit design it to be implemented;
wherein at least one of the implementation directives specifies, at least in part, a power usage requirement for the associated sub-circuit;
computer-usable program code that, responsive to determining that a portion of a sub-circuit of the circuit design is associated with an implementation directive that specifies a power usage requirement and is mappable to more than one type of component, selects one component of the more than one type of component that results in lower power consumption for mapping of the sub-circuit to the one component;
wherein at least one implementation directive of the plurality of implementation directives includes a property indicating priority of the implementation directive with respect to others of the implementation directives;
computer-usable program code that prioritizes the plurality of sub-circuits for placing and routing according to the property indicating priority of the at least one implementation directive;
computer-usable program code that places the plurality of sub-circuits for the programmable IC according to the plurality of implementation directives;
computer-usable program code that routes the plurality of sub-circuits for the programmable IC according to the plurality of implementation directives; and
computer-usable program code that outputs a programmatic description, comprising placement and routing information, for the plurality of sub-circuits.

16. The computer program product of claim 15, wherein the computer-usable medium further comprises computer-usable program code that prioritizes the placing and the routing of the sub-circuit over implementing other portions of the circuit design that are not associated with an implementation directive embedded within the register transfer level description of the circuit design.

17. The computer program product of claim 15, wherein the implementation directive comprises an instruction having a non-numerical parameter causing an implementation tool to explore a plurality of sub-circuit implementations and select a sub-circuit implementation in which a measured quantity indicated by the instruction is optimized in lieu of specifying a numerical value for the parameter of the instruction that is to be achieved for the measured quantity by the implementation tool.

18. The computer program product of claim 15, wherein the computer-usable medium further comprises computer-usable program code that selects the implementation directive to specify a skew requirement for signals of the sub-circuit.

* * * * *